United States Patent
Li et al.

(10) Patent No.: US 10,692,952 B2
(45) Date of Patent: Jun. 23, 2020

(54) OLED SUBSTRATE AND DISPLAY DEVICE

(71) Applicant: BOE TECHNOLOGY GROUP CO., LTD., Beijing (CN)

(72) Inventors: Haixu Li, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/446,067

(22) Filed: Jun. 19, 2019

(65) Prior Publication Data

US 2020/0020757 A1 Jan. 16, 2020

(30) Foreign Application Priority Data

Jul. 13, 2018 (CN) .......................... 2018 1 0772090

(51) Int. Cl.
*H01L 27/32* (2006.01)
*H01L 51/52* (2006.01)

(52) U.S. Cl.
CPC ...... *H01L 27/3272* (2013.01); *H01L 27/3258* (2013.01); *H01L 51/5281* (2013.01)

(58) Field of Classification Search
CPC ............. H01L 27/3258; H01L 27/3272; H01L 51/5281
See application file for complete search history.

(56) References Cited

U.S. PATENT DOCUMENTS

| 2002/0038998 A1 | 4/2002 | Fujita et al. | |
| 2003/0116768 A1* | 6/2003 | Ishikawa | H01L 29/78633 257/79 |
| 2005/0029926 A1* | 2/2005 | Park | H01L 27/3244 313/500 |
| 2014/0159021 A1* | 6/2014 | Song | H01L 27/322 257/40 |

FOREIGN PATENT DOCUMENTS

| CN | 102431957 A | 5/2012 |
| CN | 107046042 A | 8/2017 |

OTHER PUBLICATIONS

First Office Action for Chinese Application No. 201810772090.4, dated Sep. 4, 2019, 5 Pages.

* cited by examiner

*Primary Examiner* — Peniel M Gumedzoe
(74) *Attorney, Agent, or Firm* — Brooks Kushman P.C.

(57) ABSTRACT

The present disclosure provides an OLED substrate and a display device. The OLED substrate includes a base substrate, and a thin-film transistor, a first electrode, and a light-emitting layer arranged in sequence on the base substrate, in which the OLED substrate further includes a light-shielding layer arranged between an active layer of the thin-film transistor and the first electrode.

16 Claims, 5 Drawing Sheets

OLED SUBSTRATE AND DISPLAY DEVICE

CROSS-REFERENCE TO RELATED APPLICATION

This application claims priority to Chinese Patent Application No. 201810772090.4 filed on Jul. 13, 2018, which is incorporated herein by reference in its entirety.

TECHNICAL FIELD

The present disclosure relates to the field of display technology, and in particular to an OLED substrate and a display device.

BACKGROUND

Organic electro-luminescent display (OLED) has been widely used in the fields of display, illumination and others, due to its self-illumination, low operating voltage, light weight, flexibility, and high color saturation etc. The preparation process of the organic electro-luminescent device includes: forming a thin-film transistor (TFT) on the substrate, and forming an anode, a pixel defining layer, a light-emitting layer and a cathode in sequence on the thin-film transistor, in which the anode and the thin-film transistor are electrically connected to the drain electrode.

However, since a portion of the light emitted from the light-emitting layer is incident on the active layer of the thin-film transistor through the refraction and reflection of the film layer in the organic electro-luminescent device, the portion of the light affects the characteristics of the thin-film transistor. This causes an instability of the threshold voltage ($V_{th}$) of the thin-film transistor and an increase in off-state current ($I_{off}$), thereby affecting the light-emitting effect. In particular, in low temperature poly-silicon (LTPS) thin-film transistors, since low temperature poly-silicon is very sensitive to light, the light emitted from the light-emitting layer is incident on the low temperature poly-silicon layer, which will generate photoelectrons, thereby significantly affecting the characteristics of the thin-film transistor.

SUMMARY

In one aspect, the present disclosure provides an OLED substrate including a base substrate, and a thin-film transistor, a first electrode, and a light-emitting layer arranged in sequence on the base substrate, in which the OLED substrate further includes a light-shielding layer arranged between an active layer and the first electrode.

Optionally, a material of which the light-shielding layer is made includes amorphous silicon, the OLED substrate further includes side layers arranged on two opposite sides of the light-shielding layer and in contact with the light-shielding layer, and a material of which the side layers are made is an insulating material.

Optionally, the material of the light-shielding layer further includes sulfur doped in the amorphous silicon.

Optionally, the sulfur has a mass ratio of 0.5% to 5% based on the total mass of the material of the light-shielding layer.

Optionally, the light-shielding layer includes a plurality of depression portions on a side proximate to the light-emitting layer.

Optionally, a cross-sectional shape of the depression portion obtained by cutting the light-shielding layer along a thickness direction of the OLED substrate is a triangle.

Optionally, the depression portion does not penetrate the light-shielding layer.

Optionally, the thin-film transistor further includes an insulating layer arranged on a side of the active layer proximate to the light-emitting layer, the OLED substrate further includes a planarization layer between the thin-film transistor and the first electrode, and the insulating layer or the planarization is also used as the light-shielding layer.

Optionally, the thin-film transistor further includes an insulating layer arranged on a side of the active layer proximate to the light-emitting layer, the OLED substrate further includes a planarization layer between the thin-film transistor and the first electrode, and the side layers and the insulating layer are also used as the light-shielding layer as a whole, or the planarization layer is also used as the light-shielding layer.

In another aspect, the present disclosure provides a display device including any of the above OLED substrates.

DETAILED DESCRIPTION

The technical solutions in the embodiments of the present disclosure will be described hereinafter in conjunction with the drawings in the embodiments of the present disclosure in a clear and complete manner. Obviously, the following embodiments merely relate to a part of, rather than all of, the embodiments of the present disclosure. Based on these embodiments, a person skilled in the art may, without any creative effort, obtain the other embodiments, which also fall within the scope of the present disclosure.

The OLED substrate and the display device of the present disclosure can solve the problem that light emitted from the light-emitting layer in the organic electro-luminescent device is incident on the active layer, thereby affecting the characteristics of the thin-film transistor. The present disclosure solves the technical problem by any of the following technical solutions.

According to an embodiment of the present disclosure, there is provided an OLED substrate, including a base substrate, and a thin-film transistor, a first electrode, and a light-emitting layer arranged in sequence on the base substrate, wherein the OLED substrate further includes a light-shielding layer arranged between an active layer of the thin-film transistor and the first electrode.

Figure 1:
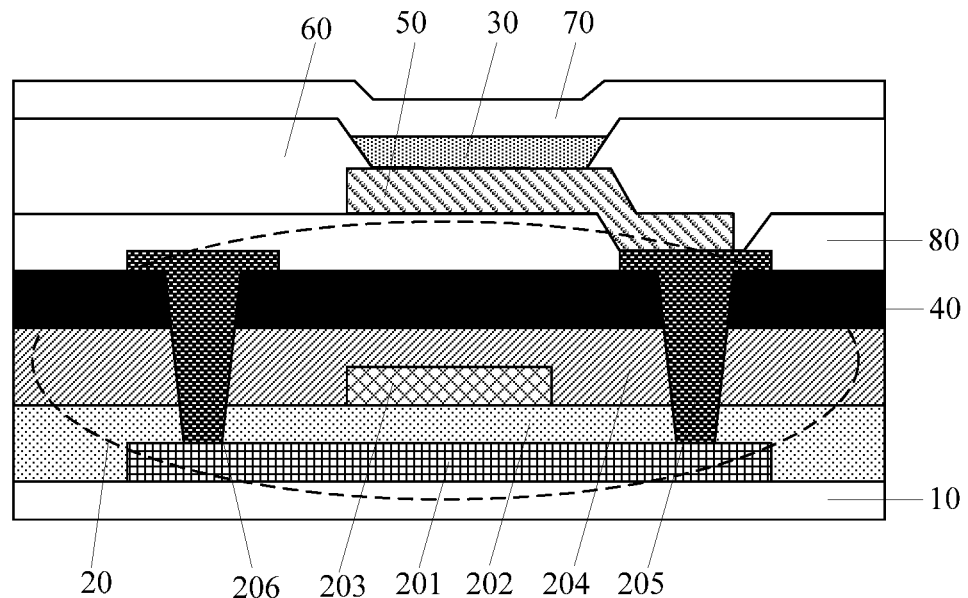
FIG. 1 is a schematic view of an OLED substrate according to an embodiment of the present disclosure.

Specifically, as shown in FIG. 1, the OLED includes a base substrate 10, and a thin-film transistor 20, a first electrode 50, and a light-emitting layer 30 which are arranged on the base substrate 10 in sequence; the thin-film transistor 20 includes an active layer 201; and the OLED substrate further includes a light-shielding layer 40 arranged between the active layer 201 and the first electrode 50.

In the OLED substrate and the display device of the embodiment of the present disclosure, since the OLED substrate further includes a light-shielding layer arranged between the active layer and the first electrode, the light-shielding layer may block light emitted from the light-emitting layer, to prevent the light emitted by the layer from being incident on the active layer and thus affecting the characteristics of the thin-film transistor. Therefore, the present disclosure stabilizes the light-emitting characteristics of the OLED substrate and increases the light-emitting stability. In addition, the light-shielding layer can not only block the ambient light incident on the OLED substrate, but also shield the light emitted from the light-emitting layer. This prevents ambient light from being emitted onto the active layer, thereby preventing from affecting the characteristics of the thin-film transistor.

The thin-film transistor 20 includes a gate electrode 203, a gate insulating layer (GI) 202, a source electrode 206, and a drain electrode 205, in addition to the active layer 201. The source electrode 206 and the drain electrode 205 are in contact with the active layer 201 through the via hole, and the drain electrode 205 of the thin-film transistor 20 is electrically connected to the first electrode 50. Further, the thin-film transistor 20 may further include a film layer, such as an interlayer dielectric layer (ILD) 204.

The type of the thin-film transistor 20 is not limited. The thin-film transistor 20 may be, for example, an amorphous silicon (a-Si) thin-film transistor, a single crystal silicon thin-film transistor, or a low temperature poly-silicon thin-film transistor. Since the low temperature poly-silicon thin-film transistor has advantages of high mobility, reducing response time, reducing power consumption, and increasing resolution and contrast, a low temperature poly-silicon thin-film transistor is often selected as the thin-film transistor 20 in the organic electro-luminescent device. Low temperature poly-silicon is more sensitive to light than amorphous silicon and single crystal silicon. Therefore, the characteristics of the low temperature poly-silicon thin-film transistor are more susceptible to illumination.

The OLED substrate includes a pixel definition layer (PDL) 60 arranged between the first electrode 50 and the light-emitting layer 30 and a second electrode 70 arranged on the light-emitting layer 30, in addition to the thin-film transistor 20, the first electrode 50, and the light-emitting layer 30 which are arranged on the base substrate 10 in sequence, as shown in FIG. 1. The pixel defining layer 60 is divided into an open area and a pixel defining area for defining an open area. The light-emitting layer 30 is located in an open area of the pixel defining layer 60. The first electrode 50 and the second electrode 70 are used to drive the light-emitting layer 30 to emit light. In addition, the first electrode 50 may be an anode, and the second electrode 70 may be a cathode; or the first electrode 50 may be a cathode, and the second electrode 70 may be an anode.

Further, the OLED substrate may further include at least one of an electron transport layer, an electron injection layer, a hole transport layer, and a hole injection layer arranged between the first electrode 50 and the second electrode 70.

Generally, as shown in FIG. 1, the OLED substrate is further provided with a planarization layer (PLN) 80 between the thin-film transistor 20 and the first electrode 50.

Based on the above, the preparation process of the OLED substrate may specifically include: firstly forming a thin-film transistor 20 on the substrate 10, forming a planarization 80 on the thin-film transistor 20, and then forming the first electrode 50, the pixel defining layer 60, and the light-emitting layer 30 and second electrode 70 in sequence.

The installation position of the light-shielding layer 40 is not limited, as long as it is arranged between the active layer 201 and the first electrode 50.

Figure 2:
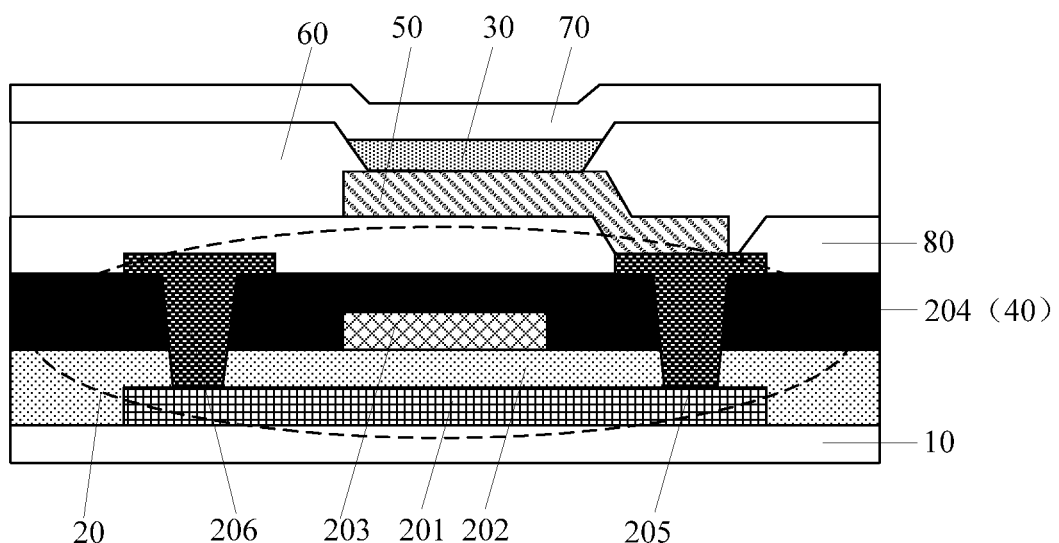
FIG. 2 is a schematic view of an OLED substrate according to another embodiment of the present disclosure.

In addition, the light-shielding layer 40 can be shared with the film layer originally present on the OLED substrate. For example, as shown in FIG. 2, the light-shielding layer 40 is shared with the interlayer dielectric layer 204 in the thin-film transistor 20, or the light-shielding layer 40 is shared with the gate insulating layer 202 in the thin-film transistor 20. That is, the interlayer dielectric layer 204 or the gate insulating layer 202 in the thin-film transistor 20 is also used as the light-shielding layer 40. As shown in FIG. 1, the light-shielding layer 40 may be additionally formed, that is, the light-shielding layer 40 is a layer different from the insulating layer such as the interlayer dielectric layer 204 or the gate insulating layer 202.

Optionally, the light-shielding layer 40 may be a light-absorbing layer. At this time, the material for preparing the light-shielding layer 40 may be, for example, a black ink or a black resin. Optionally, the light-shielding layer 40 may also be a reflective layer. At this time, the material for preparing the light-shielding layer 40 may be, for example, a metal material. The reflective layer reflects the light emitted by the light-emitting layer 30 or the ambient light that is incident thereon, and the excessive reflected light affects the light-emitting effect of the OLED substrate. Therefore, the light-shielding layer 40 of the embodiment of the present disclosure is preferably a light-absorbing layer.

Figure 3:
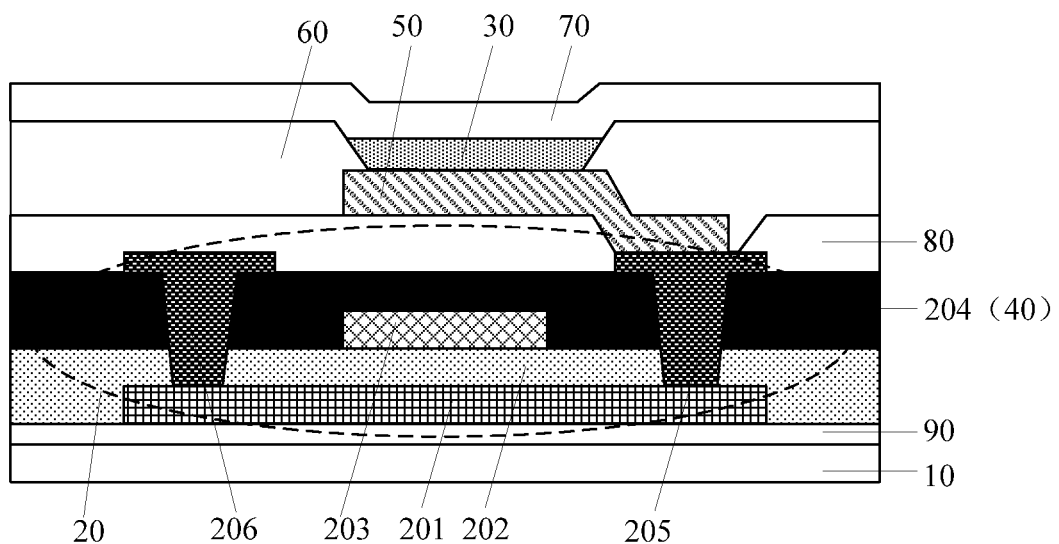
FIG. 3 is a schematic view of an OLED substrate according to a still another embodiment of the present disclosure.

As shown in FIG. 3, a buffer layer 90 may be arranged between the base substrate 10 and the thin-film transistor 20. The buffer layer 90 can not only flatten the base substrate 10 and shield the defects of the substrate 10, but also prevent impurity ions from penetrating into the base substrate 10 to cause various defects of the device.

Figure 4:
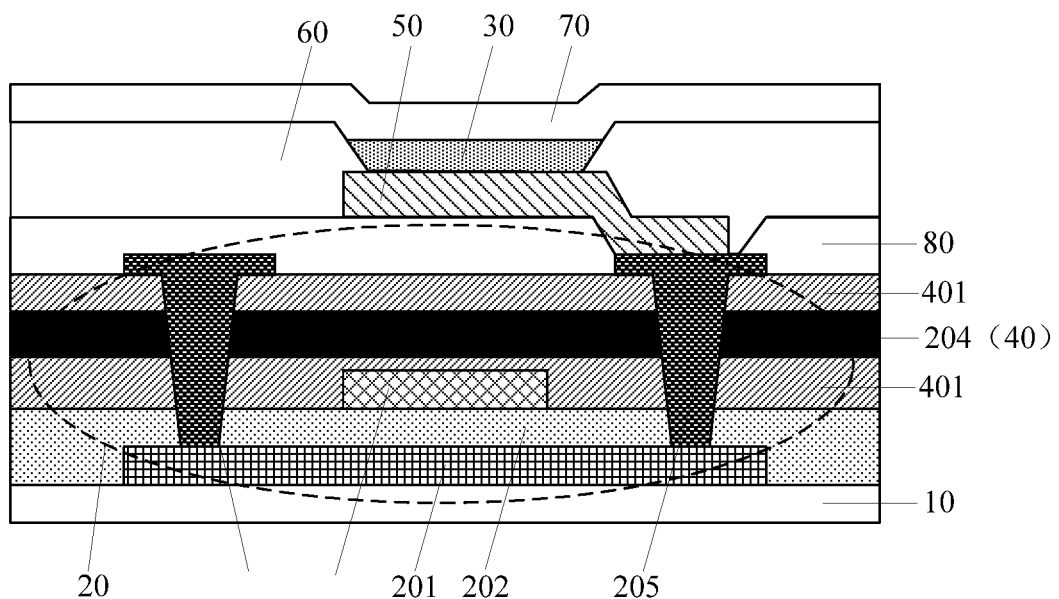
FIG. 4 is a schematic view of an OLED substrate according to a still another embodiment of the present disclosure.

Optionally, the material for preparing the light-shielding layer 40 includes amorphous silicon. As shown in FIG. 4, the OLED substrate further includes side layers 401 arranged on the upper and lower surface sides of the light-shielding layer 40 and in contact with the light-shielding layer 40. The material for the side layer 401 is an insulating material. Amorphous silicon has a greater absorption to visible light, especially to short-wavelength visible light. Therefore, when the material of the light-shielding layer 40 includes amorphous silicon, the light-shielding layer 40 corresponds to the light-absorbing layer, and visible light can be absorbed.

It should be noted that the light-shielding layer 40 provided in the OLED substrate of the embodiment of the present disclosure should not affect the performance of other film layers or devices; when the material of the light-shielding layer 40 includes amorphous silicon of a semiconductor material, in order to avoid the influence of amorphous silicon on the performance of other film layers, such that upper and lower side layers 401, which are in contact with the light-shielding layer 40, are arranged on the upper and lower sides of the amorphous silicon layer.

Optionally, the material for preparing the side layer 401 is an insulating material. The material of the side layers 401 may be, for example, at least one of silicon oxide ($SiO_x$), silicon nitride ($SiN_x$), or silicon oxynitride ($SiO_xN_y$).

Optionally, the thicknesses of the light-shielding layer 40 and the upper and lower side layers 401 are not limited. Optionally, the thickness of the light-shielding layer may be 2000 Å to 5000 Å. Optionally, one of the upper and lower side layers 401 may have a thickness of 1000 Å to 3000 Å. Further, when the upper and lower side layers 401 are made of silicon oxide, one of the upper and lower side layers 401 may have a thickness of 1000 Å to 3000 Å; and when the upper and lower side layers 401 are made of silicon nitride, the upper and lower side layers 401 have a thickness of 2000 Å to 3000 Å.

Since the material for preparing the light-shielding layer 40 is amorphous silicon, the light-shielding layer 40 can absorb the light emitted from the light-emitting layer 30 and block the light emitted from the light-emitting layer 30 from being incident on the active layer 201, thereby preventing form affecting the characteristics of the thin-film transistor. In addition, the light-shielding layer 40 can also absorb external ambient light incident into the OLED substrate, thereby preventing the excessive reflected light, after the external ambient light and the light emitted by the light-emitting layer 30 is reflected by the film layer in the OLED substrate, from affecting the light-emitting effect.

When the material for preparing the light-shielding layer 40 includes amorphous silicon, although amorphous silicon can absorb visible light, amorphous silicon still has a transmittance of about 30% to 70% for long-wavelength visible light (for example, red light and green light). Optionally, the material for preparing the light-shielding layer 40 further includes sulfur (S) doped in amorphous silicon. It should be noted that after sulfur is doped into a-Si, the light-absorbing performance of the light-shielding layer 40 is increased, and the reason why the addition of sulfur increases the light-absorbing performance is that an impurity state contributed by the dopant atoms appears below the conduction band of the a-Si, so that the band is narrowed. After doping sulfur in a-Si, a Si—S bond is formed. According to the simulation calculation, after the sulfur is doped in a-Si, the band of a-Si is changed from about 1.7 eV to about 0.551 eV. In addition, the 3 s state of S appears in the conduction band portion, and the 3 p state of S increases in the valence band portion. This change in energy band can increase the range and intensity of light absorption, and the band of absorbed light can be expanded to 250 nm to 1000 nm (390 to 780 nm in the visible region), in which the absorption range includes the UV-NIR region.

There is no limitation on how to allow the material for preparing light-shielding layer 40 to contain amorphous silicon and sulfur doped in amorphous silicon. Two specific implementations are provided below as examples. First, the amorphous silicon and the sulfur are first doped and mixed, and then the light-shielding layer 40 is formed. Second, an amorphous silicon layer is formed first, and then an amorphous silicon layer is etched by using $SF_6$ (sulfur hexafluoride). Thus, in the etching process of $SF_6$, sulfur element is doped into the amorphous silicon layer, thereby allowing the material for preparing light-shielding layer 40 to contain amorphous silicon and sulfur doped in amorphous silicon.

The content of sulfur doped in the amorphous silicon is not limited, and an appropriate amount of sulfur may be doped into the amorphous silicon as needed. If the content of sulfur doped in the amorphous silicon is too small, the improvement in the light-absorbing effect of the light-shielding layer 40 is not obvious. The light-absorbing effect of the light-shielding layer 40 gradually increases as the content of sulfur doped in the amorphous silicon increases. However, when the sulfur content is increased to a certain extent, the light-absorbing effect of the light-shielding layer 40 does not increase. Therefore, the mass of sulfur in the embodiment of the present disclosure is preferably 0.5% to 5% based on the total mass of the material of the light-shielding layer 40.

When the material of the light-shielding layer 40 includes amorphous silicon, doping sulfur in the amorphous silicon improves the light-absorbing efficiency and the light-absorbing intensity of the light-shielding layer 40, thereby enhancing the light-shielding effect of the light-shielding layer 40.

Figure 5A:
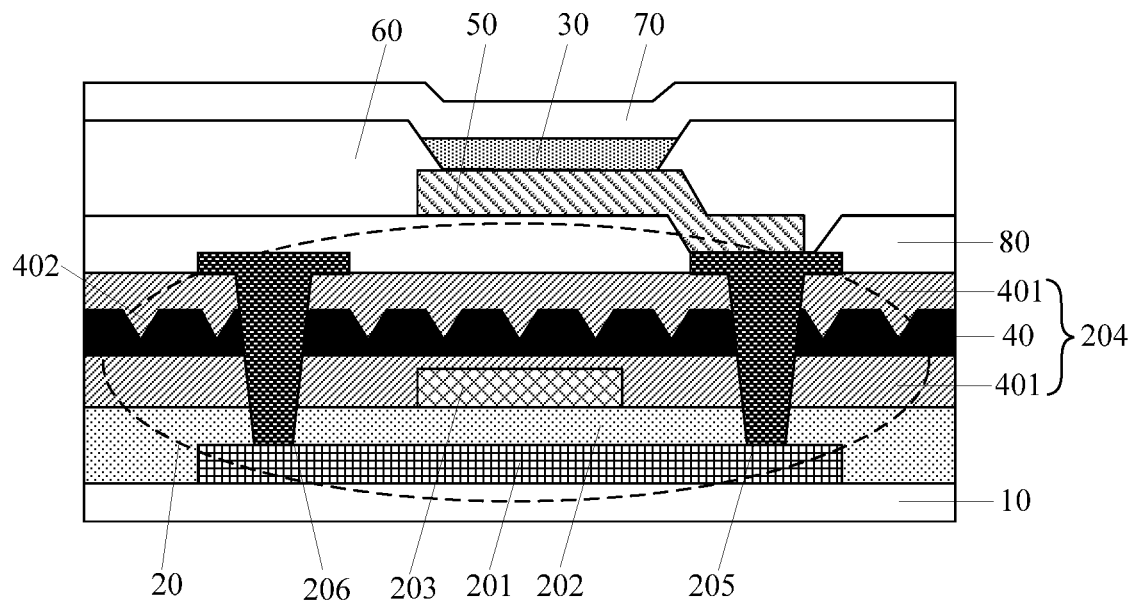
FIG. 5(a) is a schematic view of an OLED substrate according to a still another embodiment of the present disclosure.
Figure 5B:
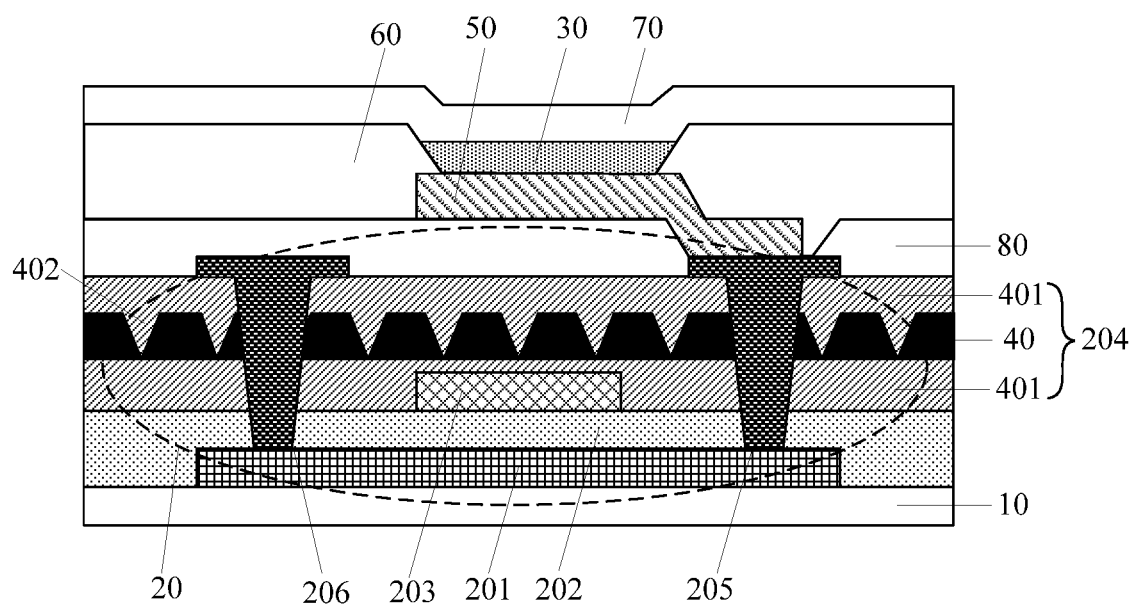
FIG. 5(b) is a schematic view of an OLED substrate according to a still another embodiment of the present disclosure.

Optionally, as shown in FIGS. 5(a) and 5(b), the light-shielding layer 40 includes a plurality of depression portions 402 on a side proximate to the light-emitting layer 30.

The cross-sectional shape of the depression portion 402 taken along the thickness direction of the OLED substrate is not limited. The cross-sectional shape of the depression portion 402 may be a triangle as shown in FIGS. 5(a) and 5(b), or a trapezoidal, semi-circular shape (in which a semicircle is not shown in the drawing), or the like.

In addition, the plurality of depression portions 402 arranged on a side proximate to the light-emitting layer 30 may be distributed in a dot shape on the light-shielding layer 40 or may be distributed in a strip shape on the light-shielding layer 40.

The depression depth of the depression portion 402 is not limited, and may be set as needed. The depression portion 402 may not penetrate the light-shielding layer 40 as shown in FIG. 5(a), or may penetrate the light-shielding layer 40 as shown in FIG. 5(b). When the depression portion 402 does not penetrate the light-shielding layer 40, the light is incident on the depression portion 402 and passes through the remaining thickness of the light-shielding layer 40, thereby further ensuring the absorption of light. Therefore, the depression portion 402 of the embodiment of the present disclosure preferably does not penetrate the light-shielding layer 40. When the depression portion 402 does not penetrate the light-shielding layer 40, the light-shielding layer 40 includes the first light-shielding sublayer and the second light-shielding sublayer which are laminated. The first light-shielding sublayer is provided with a depression portion 402, and the thickness of the first light-shielding sublayer is the same as the depression depth of the depression portion 402. The thickness of the second light-shielding sublayer is not limited. In an optional embodiment of the present disclosure, the second light-shielding sublayer has a thickness of 100 to 900 Å.

The formation of the depression portion 402 on the side of the light-shielding layer 40 proximate to the light-emitting layer 30 is not limited. A light-shielding layer film can be formed first. For example, the light-shielding layer film may be formed by a deposition method, and the light-shielding layer film may be exposed, developed, and etched, for example, by a dry etch process, to form the light-shielding layer 40. That is, a plurality of depression portions 402 is formed on the light-shielding layer film by an incomplete etching method.

Figure 6:
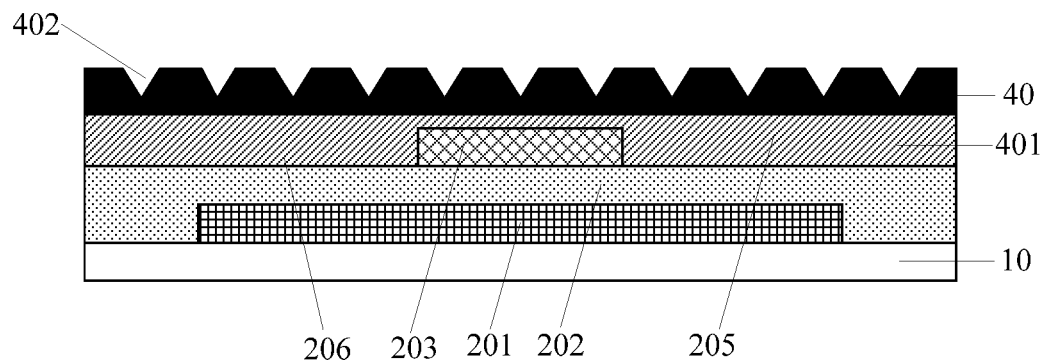
FIG. 6 is a schematic view of forming a lower side layer and a light-shielding layer on a base substrate according to a still another embodiment of the present disclosure.
Figure 7:
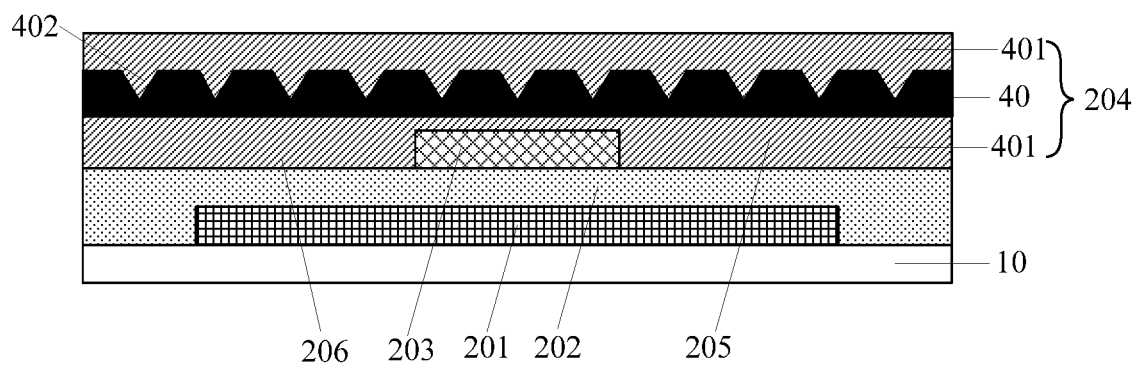
FIG. 7 is a schematic view of forming a lower side layer, a light-shielding layer, and an upper side layer on a base substrate according to a still another embodiment of the present disclosure.

It should be noted that when the light-shielding layer 40 includes a plurality of depression portions 402 on the side proximate to the light-emitting layer 30, and the material for preparing the light-shielding layer 40 is amorphous silicon, as shown in FIG. 6, the lower side layer 401 may be deposited first, a light-shielding layer thin film is further formed, and the light-shielding layer thin film is patterned to form the light-shielding layer 40, and then the upper side layer 401 is further formed on the light-shielding layer 40, as shown in FIG. 7.

In the embodiment of the present disclosure, since the light-shielding layer 40 includes a plurality of depression portions 402 on a side proximate to the light-emitting layer 30, the depression portion 402 facilitates the falling of the incident light and reduces the reflected light, thereby improving the light-absorbing effect of the light-shielding layer 40.

Figure 8:
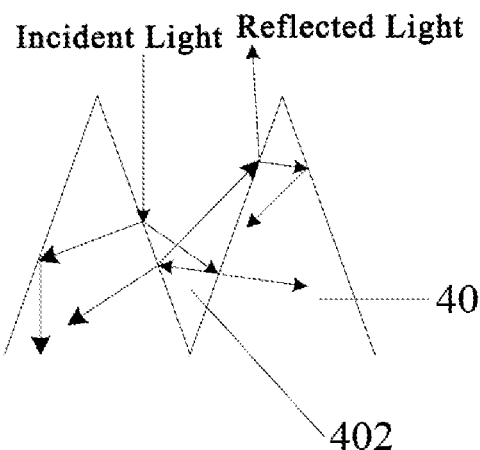
FIG. 8 is a schematic view of an optical path reflected and refracted after incident light is incident on a depression portion according to a still another embodiment of the present disclosure.

Since the cross-sectional shape of the depression portion 402 obtained after the light-shielding layer 40 is cut along the thickness direction of the OLED substrate is a triangle, as shown in FIG. 8, after the incident light is incident on the depression portion 402, a portion of the light is reflected, and a portion of the light is refracted. The refracted light is absorbed. After the incident light is reflected and refracted multiple times, the intensity of the light finally reflected from the light-shielding layer 40 is greatly weakened, thereby effectively improving the light-absorbing effect of the light-shielding layer 40. Therefore, as shown in FIGS. 5(a) and 5(b), the cross-sectional shape of the depression portion 402 obtained by taking the light-shielding layer 40 along the thickness direction of the OLED substrate is preferably a triangle.

When the cross-sectional shape of the depression portion 402 obtained by taking the light-shielding layer 40 along the thickness direction of the OLED substrate is a triangle, the depression portion 402 may be distributed in a dot shape on the light-shielding layer 40 or may be distributed in a strip shape on the light-shielding layer 40. Optionally, the depression portions 402 are distributed in a dot shape on the light-shielding layer 40. Further optionally, when the depression portion 402 is distributed in a dot shape on the light-shielding layer 40, the depression portion 402 has a conical structure.

Optionally, the thin-film transistor 20 further includes an insulating layer arranged on a side of the active layer 201 proximate to the light-emitting layer 30. Optionally, the OLED substrate further includes a planarization layer 80 arranged between the thin-film transistor 20 and the first electrode 50. Optionally, the light-shielding layer 40 is shared with the insulating layer or the planarization layer 80, that is, the insulating layer and the planarization are also used as the light-shielding layer.

It should be noted that, in the case where the light-shielding layer 40 is shared with the insulating layer, the thin-film transistor 20, as shown in FIG. 2, includes the active layer 201, the gate insulating layer 202, the gate electrode 203, and the interlayer dielectric layer 204, the source electrode 206, and the drain electrode 205, which are arranged in sequence. At this time, since the insulating layer of the thin-film transistor 20 may be the gate insulating layer 202 or the interlayer dielectric layer 204, the light-shielding layer 40 may be shared with the gate insulating layer 202, or shared with the light-shielding layer 40 and the interlayer dielectric layer 204 as shown in FIGS. 2 and 3. When the thin-film transistor includes the active layer 201, the source electrode 206, the drain electrode 205, the gate insulating layer 202, and the gate electrode 203 which are arranged in sequence, the insulating layer of the thin-film transistor 20 is the gate insulating layer 202, and thus the light-shielding layer 40 is shared with the gate insulating layer 202.

When the light-shielding layer 40 is shared with the insulating layer, the light-shielding layer 40 should serve both as a function of light-shielding and as a function of insulation. When the light-shielding layer 40 is shared with the planarization layer 80, the light-shielding layer 40 should serve both as a function of light-shielding and as a function of flattening.

In an optional embodiment of the present disclosure, by sharing the light-shielding layer 40 with the insulating layer of the planarization layer 80 or the thin-film transistor 20, the step of separately forming the light-shielding layer can be reduced as compared with additionally providing the light-shielding layer 40. This simplifies the preparation process of the OLED substrate.

Optionally, the thin-film transistor 20 further includes an insulating layer arranged on a side of the active layer 201 proximate to the light-emitting layer 30. Optionally, the OLED substrate further includes a planarization layer 80 arranged between the thin-film transistor 20 and the first electrode 50. Optionally, the light-shielding layer 40 and the two side layers 401 are combined with the insulating layer or shared with the planarization layer 80, that is, the two side layers 401 and the insulating layer are also used integrally as the light-shielding layer 40, or the planarization layer 80 is also used as the light-shielding layer.

It should be noted that, in the case where the light-shielding layer 40 and two side layers 401 are shared with the insulating layer, the thin-film transistor 20, as shown in FIG. 2, includes the active layer 201, the gate insulating layer 202, the gate electrode 203, and the interlayer dielectric layer 204, the source electrode 206, and the drain electrode 205, which are arranged in sequence. At this time, since the insulating layer of the thin-film transistor 20 may be the gate insulating layer 202 or the interlayer dielectric layer 204, the light-shielding layer 40 and two side layers 401 may be shared with the gate insulating layer 202, or shared with the light-shielding layer 40 and two side layers 401 as shown in FIGS. 4, 5(a), 5(b), 7 and 9. When the thin-film transistor includes the active layer 201, the source electrode 206, the drain electrode 205, the gate insulating layer 202, and the gate electrode 203 which are arranged in sequence, the insulating layer of the thin-film transistor 20 is the gate insulating layer 202, and thus the light-shielding layer 40 and the two side layers 401 are shared with the gate insulating layer 202.

Figure 9:
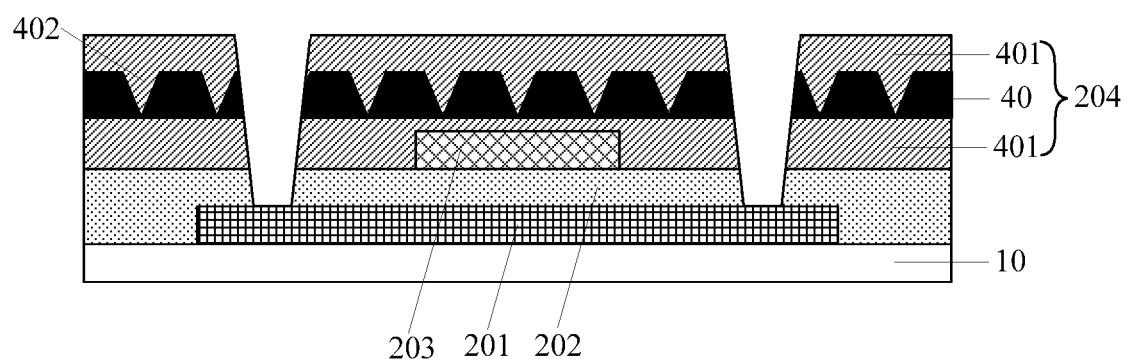
FIG. 9 is a schematic view of forming a source contact hole and a drain contact hole on an interlayer dielectric layer and a gate insulating layer according to a still another embodiment of the present disclosure.

When the thin-film transistor 20 includes the active layer 201, the gate insulating layer 202, the gate electrode 203, the interlayer dielectric layer 204, the source electrode 206, and the drain electrode 205, which are arranged in sequence, the process for preparing the thin-film transistor includes: after the forming the gate insulating layer 202, the gate electrode 203 and the interlayer dielectric layer 204 in sequence, as shown in FIG. 9 (in FIG. 9, the light-shielding layer 40 and the two side layers 401 are shared with the interlayer dielectric layer 204 as an example), a dielectric layer 204 and a gate insulating layer 202 are exposed, developed, and etched to form a source contact via hole and a drain contact via hole, and then a source electrode 206 and a drain electrode 205 are formed. The source electrode 206 is in contact with the active layer 201 through a source contact hole, and the drain electrode 205 is in contact with the active layer 201 through a drain contact hole.

When the light-shielding layer 40 and the two upper and lower side layers 401 are shared with the insulating layer, the light-shielding layer 40 and the two upper and lower side layers 401 should serve both as a function of light-shielding and as a function of insulation; and when the light-shielding layer 40 and the two upper and lower side layers 401 are shared with the planarization 80, the light-shielding layer 40 and the two upper and lower side layers 401 should serve both as a function of light-shielding and as a function of flattening.

In the embodiment of the present disclosure, by sharing the light-shielding layer 40 and the two upper and lower side layers 401 with the planarization layer 80 or the insulating layer of the thin-film transistor 20, the step of forming one light-shielding layer can be reduced as compared with the additional providing the light-shielding layer 40. This simplifies the preparation process of the OLED substrate.

Another embodiment of the present disclosure further provides a display device including any of the above OLED substrates.

The display device may be any device that displays an image regardless of being movable (e.g., video) or fixed (e.g., still image) and regardless of text or picture. More specifically, it is expected that the described embodiments can be implemented in or associated with various electronic devices. The various electronic devices include, but not limited to, mobile phones, wireless devices, personal data assistants (PDA), handheld or portable computers, GPS receivers/navigators, cameras, MP4 video players, video cameras, game consoles, watches, clocks, calculators, television monitors, flat panel displays, computer monitors, car displays (e.g., odometer display, etc.), navigator, cockpit controller and/or displays, camera view displays (e.g., displays for a rear-view camera in a vehicle) electronic photographs, electronic billboards or signs, projectors, architectural structures, packaging and aesthetic structures (e.g., displays for images of a piece of jewelry), etc. Further, the display device may also be a display panel.

The display device includes a package film or a package substrate for packaging the OLED substrate, in addition to the OLED substrate.

A display device according to one embodiment of the present disclosure includes the above-described OLED substrate. The OLED substrate in the display device has the same technical features and advantageous effects as the OLED substrate described above. Since the technical features and advantageous effects of the OLED substrate have been described in detail above, they will be not described herein again.

The above description is merely the optional embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. An organic light-emitting diode (OLED) substrate, comprising a base substrate, and a thin-film transistor, a first electrode, and a light-emitting layer arranged in sequence on the base substrate, wherein the OLED substrate further comprises a light-shielding layer arranged between an active layer of the thin-film transistor and the first electrode, wherein a material of the light-shielding layer comprises amorphous silicon, and the OLED substrate further comprises side layers arranged on two opposite sides of the light-shielding layer and in contact with the light-shielding layer, and wherein a material of the side layers is an insulating material, wherein the material of the light-shielding layer further comprises sulfur doped in the amorphous silicon.

2. The OLED substrate of claim 1, wherein the sulfur has a mass ratio of 0.5% to 5% based on the total mass of the material of the light-shielding layer.

3. The OLED substrate of claim 1, wherein the light-shielding layer comprises a plurality of depression portions on a side proximate to the light-emitting layer.

4. The OLED substrate of claim 3, wherein a cross-sectional shape of the depression portion obtained by cutting the light-shielding layer along a thickness direction of the OLED substrate is a triangle.

5. The OLED substrate of claim 4, wherein the depression portion does not penetrate through the light-shielding layer.

6. The OLED substrate of claim 1, wherein the light-shielding layer comprises a plurality of depression portions on a side proximate to the light-emitting layer.

7. The OLED substrate of claim 6, wherein a cross-sectional shape of the depression portion obtained by cutting the light-shielding layer along a thickness direction of the OLED substrate is a triangle.

8. The OLED substrate of claim 7, wherein the depression portion does not penetrate through the light-shielding layer.

9. The OLED substrate of claim 1, wherein the thin-film transistor further comprises an insulating layer arranged on a side of the active layer proximate to the light-emitting layer, the OLED substrate further comprises a planarization layer between the thin-film transistor and the first electrode, and the insulating layer or the planarization layer is also used as a light-shielding layer.

10. The OLED substrate of claim 1, wherein the thin-film transistor further comprises an insulating layer arranged on a side of the active layer proximate to the light-emitting layer, the OLED substrate further comprises a planarization layer between the thin-film transistor and the first electrode, and the side layers and the insulating layer are also used as a light-shielding layer as a whole, or the planarization layer is also used as a light-shielding layer.

11. A display device comprising the OLED substrate of claim 1.

12. The display device of claim 11, wherein the sulfur has a mass ratio of 0.5% to 5% based on the total mass of the material of the light-shielding layer.

13. The display device of claim 11, wherein the light-shielding layer comprises a plurality of depression portions on a side proximate to the light-emitting layer.

14. The display device of claim 13, wherein a cross-sectional shape of the depression portion obtained by cutting the light-shielding layer along a thickness direction of the OLED substrate is a triangle.

15. The display device of claim 13, wherein the depression portion does not penetrate through the light-shielding layer.

16. The display device of claim 11, wherein the thin-film transistor further comprises an insulating layer arranged on a side of the active layer proximate to the light-emitting layer, the OLED substrate further comprises a planarization layer between the thin-film transistor and the first electrode, and the insulating layer or the planarization layer is also used as a light-shielding layer.

* * * * *